(12) United States Patent
Smith et al.

(10) Patent No.: US 10,141,462 B2
(45) Date of Patent: Nov. 27, 2018

(54) SOLAR CELLS HAVING DIFFERENTIATED P-TYPE AND N-TYPE ARCHITECTURES

(71) Applicant: SUNPOWER CORPORATION, San Jose, CA (US)

(72) Inventors: David D. Smith, Campbell, CA (US); Ann Waldhauer, La Honda, CA (US); Venkatasubramani Balu, Santa Clara, CA (US); Kieran Mark Tracy, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 77 days.

(21) Appl. No.: 15/384,061

(22) Filed: Dec. 19, 2016

(65) Prior Publication Data

US 2018/0175221 A1 Jun. 21, 2018

(51) Int. Cl.

| H01L 31/044 | (2014.01) |
|---|---|
| H01L 31/0236 | (2006.01) |
| H01L 31/068 | (2012.01) |
| H01L 31/0368 | (2006.01) |
| H01L 31/18 | (2006.01) |

(52) U.S. Cl.
CPC .. *H01L 31/02363* (2013.01); *H01L 31/03682* (2013.01); *H01L 31/068* (2013.01); *H01L 31/1804* (2013.01)

(58) Field of Classification Search
CPC ........ H01L 31/00–31/078; Y02E 10/50–10/60

USPC ................................................. 136/243–265
See application file for complete search history.

(56) References Cited

U.S. PATENT DOCUMENTS

| 9,196,758 | B2 | 11/2015 | Rim et al. | |
|---|---|---|---|---|
| 2010/0078069 | A1* | 4/2010 | Ide | H01L 31/022425 136/256 |
| 2013/0210187 | A1* | 8/2013 | Takahama | H01L 31/022441 438/71 |
| 2015/0179838 | A1* | 6/2015 | Rim | H01L 31/022441 136/256 |
| 2015/0280027 | A1* | 10/2015 | Moors | H01L 31/022441 136/256 |
| 2016/0087122 | A1 | 3/2016 | Westerberg et al. | |
| 2016/0118515 | A1* | 4/2016 | Mori | H01L 31/022441 136/256 |

* cited by examiner

*Primary Examiner* — Bach T Dinh
(74) *Attorney, Agent, or Firm* — Schwabe, Williamson & Wyatt, P.C.

(57) ABSTRACT

Methods of fabricating solar cell emitter regions with differentiated P-type and N-type region architectures, and the resulting solar cells, are described herein. In an example, a solar cell includes an N-type semiconductor substrate having a light-receiving surface and a back surface. A plurality of N-type polycrystalline silicon regions is disposed on a first thin dielectric layer disposed on the back surface of the N-type semiconductor substrate. A plurality of P-type polycrystalline silicon regions is disposed on a second thin dielectric layer disposed in a corresponding one of a plurality of trenches interleaving the plurality of N-type polycrystalline silicon regions in the back surface of the N-type semiconductor substrate.

9 Claims, 8 Drawing Sheets

SOLAR CELLS HAVING DIFFERENTIATED P-TYPE AND N-TYPE ARCHITECTURES

TECHNICAL FIELD

Embodiments of the present disclosure are in the field of renewable energy and, in particular, solar cells with solar cell emitter regions having differentiated P-type and N-type regions architectures.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

Methods of fabricating solar cell emitter regions with differentiated P-type and N-type region architectures, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells. In one embodiment, a solar cell includes an N-type semiconductor substrate having a light-receiving surface and a back surface. A plurality of N-type polycrystalline silicon regions is disposed on a first thin dielectric layer disposed on the back surface of the N-type semiconductor substrate. A plurality of P-type polycrystalline silicon regions is disposed on a second thin dielectric layer disposed in a corresponding one of a plurality of trenches interleaving the plurality of N-type polycrystalline silicon regions in the back surface of the N-type semiconductor substrate. A total area of the plurality of N-type polycrystalline silicon regions is greater than a total area of the plurality of P-type polycrystalline silicon regions in the plurality of corresponding trenches.

In another embodiment, a solar cell includes an N-type semiconductor substrate having a light-receiving surface and a back surface. A plurality of N-type polycrystalline silicon regions is disposed on a first thin dielectric layer disposed on the back surface of the N-type semiconductor substrate. A plurality of P-type polycrystalline silicon regions is disposed on a second thin dielectric layer disposed in a corresponding one of a plurality of trenches interleaving the plurality of N-type polycrystalline silicon regions in the back surface of the N-type semiconductor substrate. Each of the plurality of N-type polycrystalline silicon regions has a thickness relative to a thickness of each of the plurality of P-type polycrystalline silicon regions by a ratio of 3:1 or less.

Also disclosed herein are methods of fabricating solar cells. In one embodiment, a method of fabricating a solar cell includes forming an N-type silicon layer on a first thin dielectric layer formed on a back surface of a substrate. The substrate has a light-receiving surface and the back surface. The N-type silicon layer is formed using an in situ doping chemical vapor deposition (CVD) process. An insulator layer is formed on the N-type silicon layer. A plurality of openings is formed in the insulator layer and the N-type silicon layer and a corresponding plurality of trenches is formed in the back surface of the substrate. A P-type silicon layer is formed on a second thin dielectric layer formed in the plurality of trenches using a solid-state doping process.

In a first aspect, one or more embodiments described herein are directed to forming P+ and N+ polysilicon emitter regions for a solar cell where the respective structures of the P+ and N+ polysilicon emitter regions are different from one another. Such an approach can be implemented to simplify a solar cell fabrication process. Furthermore, the resulting structure may provide a lower breakdown voltage and lower power losses associated as compared with other solar cell architectures.

In a second aspect, one or more embodiments described herein are directed to silicide formation for solar cell fabrication. The silicide material can be incorporated into a final solar cell structure, such as a back contact or front contact solar cell structure. Using a silicide material for metallization of a polysilicon emitter region of a solar cell can provide a simpler metallization process for such solar cells. For example, as described in greater detail below, a silicide technique is used to effectively remove a masking operation from a metal seed layer process for contact formation. Furthermore, alignment issues can be reduced since the silicide process is a self-aligned process.

Figure 1:
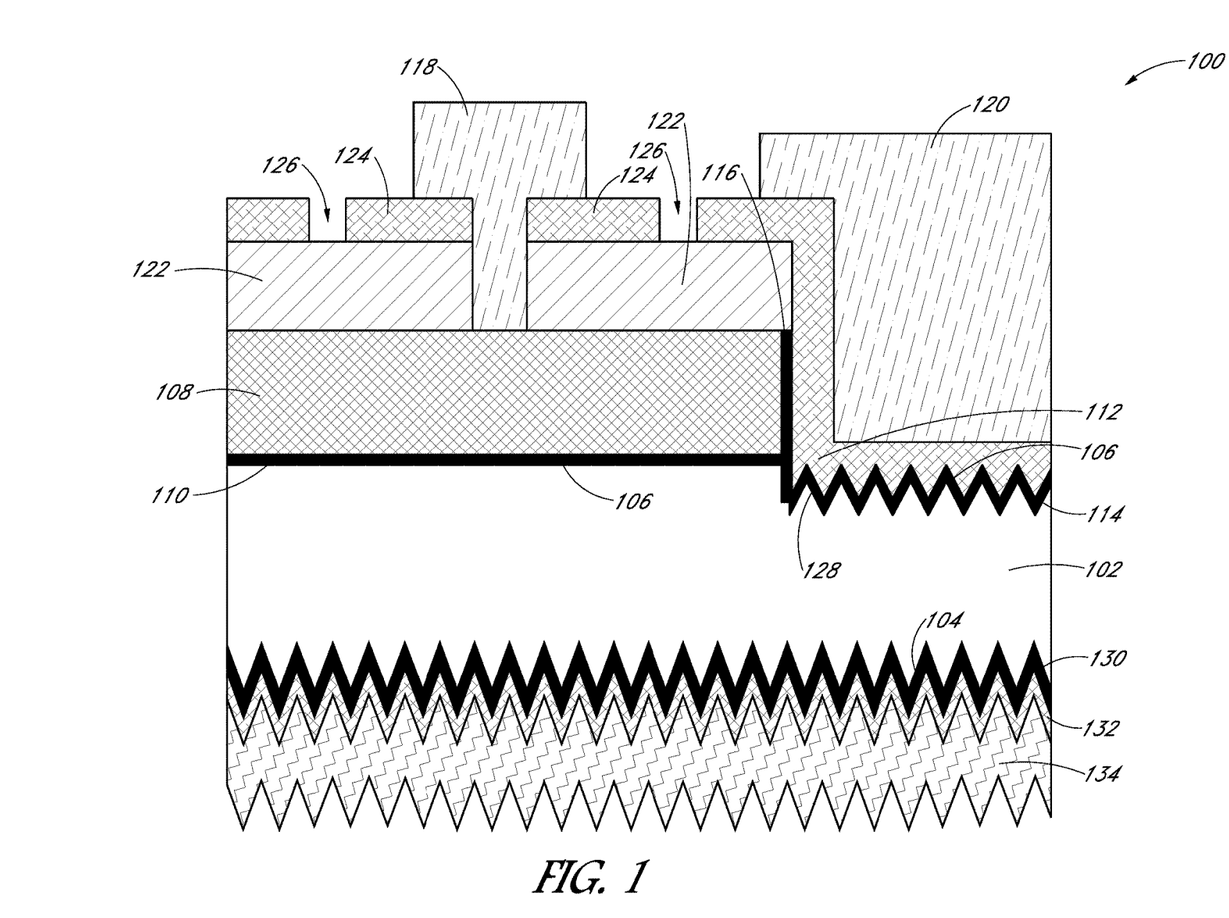
FIG. 1 illustrates a cross-sectional view of a portion of a back contact solar cell, in accordance with an embodiment of the present disclosure.

In a first example, FIG. 1 illustrates a cross-sectional view of a portion of a back contact solar cell 100, in accordance with an embodiment of the present disclosure. The solar cell 100 includes a substrate 102 having a light-receiving surface 104 and a back surface 106. An N-type polycrystalline silicon emitter region 108 is disposed on a first thin dielectric layer 110 disposed on the back surface 106 of the substrate 102. A P-type polycrystalline silicon emitter region 112 is disposed on a second thin dielectric layer 114 disposed on the back surface 106 of the substrate 102. A third thin dielectric layer 116 is disposed laterally directly between the N-type 108 and P-type 112 polycrystalline silicon emitter regions. A first conductive contact structure 118 is disposed on the N-type polycrystalline silicon emitter region 108. A second conductive contact structure 120 is disposed on the P-type polycrystalline silicon emitter region 112.

Referring again to FIG. 1, in an embodiment, the solar cell 100 further includes an insulator layer 122 disposed on the N-type polycrystalline silicon emitter region 108. The first conductive contact structure 118 is disposed through the insulator layer 122. Additionally, a portion of the P-type polycrystalline silicon emitter region 112 overlaps the insulator layer 122 but is separate from the first conductive contact structure 118. In an embodiment, an additional P-type polycrystalline silicon layer 124 is disposed on the insulator layer 122, and the first conductive contact structure 118 is disposed through the P-type polycrystalline silicon layer 124 of the second conductivity type and through the insulator layer 122, as is depicted in FIG. 1. As described in greater detail below, in one such embodiment, the additional P-type polycrystalline silicon layer 124 and the P-type polycrystalline silicon emitter region 112 are formed from a same layer that is blanket deposited and then scribed to provide scribe lines 126 therein.

Referring again to FIG. 1, in an embodiment, the solar cell 100 further includes a recess 128 disposed in the back surface 106 of the substrate 102. The recess 128 is referred to as such with respect to the back surface 106 of the solar cell 100, in that the recess 129 has an uppermost surface recessed below the back surface 106. The P-type polycrystalline silicon emitter region 112 and the second thin dielectric layer 114 are disposed in the recess 128. In one such embodiment, the recess 128 has a texturized surface, and the P-type polycrystalline silicon emitter region 112 and the second thin dielectric layer 114 are conformal with the texturized surface, as is depicted in FIG. 1. In an embodiment, then, the N-type polycrystalline silicon emitter region 108 and the first thin dielectric layer 110 are disposed on a flat portion of the back surface 106 of the substrate 102, and the P-type polycrystalline silicon emitter region 112 and the second thin dielectric layer 114 are disposed on a texturized portion of the back surface 106 of the substrate, as is depicted in FIG. 1. It is to be appreciated, however, that other embodiments may not include a texturized surface, or may not include a recess altogether.

Referring again to FIG. 1, in an embodiment, the solar cell 100 further includes a fourth thin dielectric layer 130 disposed on the light-receiving surface 104 of the substrate 102. An N-type polycrystalline silicon layer 132 is disposed on the fourth thin dielectric layer 132. An anti-reflective coating (ARC) layer 134, such as a layer of silicon nitride, is disposed on the N-type polycrystalline silicon layer 132. In one such embodiment, as described in greater detail below, the fourth thin dielectric layer 132 is formed by essentially the same process used to form the second thin dielectric layer 114.

In an embodiment, the substrate 102 is an N-type monocrystalline silicon substrate. In an embodiment, the first thin dielectric layer 110, the second thin dielectric layer 114 and the third thin dielectric layer 116 include silicon dioxide. However, in another embodiment, the first thin dielectric layer 110 and the second thin dielectric layer 114 include silicon dioxide, while the third thin dielectric layer 116 includes silicon nitride. In an embodiment, insulator layer 122 includes silicon dioxide.

In an embodiment, the first conductive contact structure 118 and the second conductive contact structure 120 each include an aluminum-based metal seed layer disposed on the first 108 and second 112 polycrystalline silicon emitter regions, respectively. In one embodiment, each of the first conductive contact structure 118 and the second conductive contact structure 120 further includes a metal layer, such as a copper layer or an aluminum metal foil, disposed on the aluminum-based metal seed layer.

Figure 2:
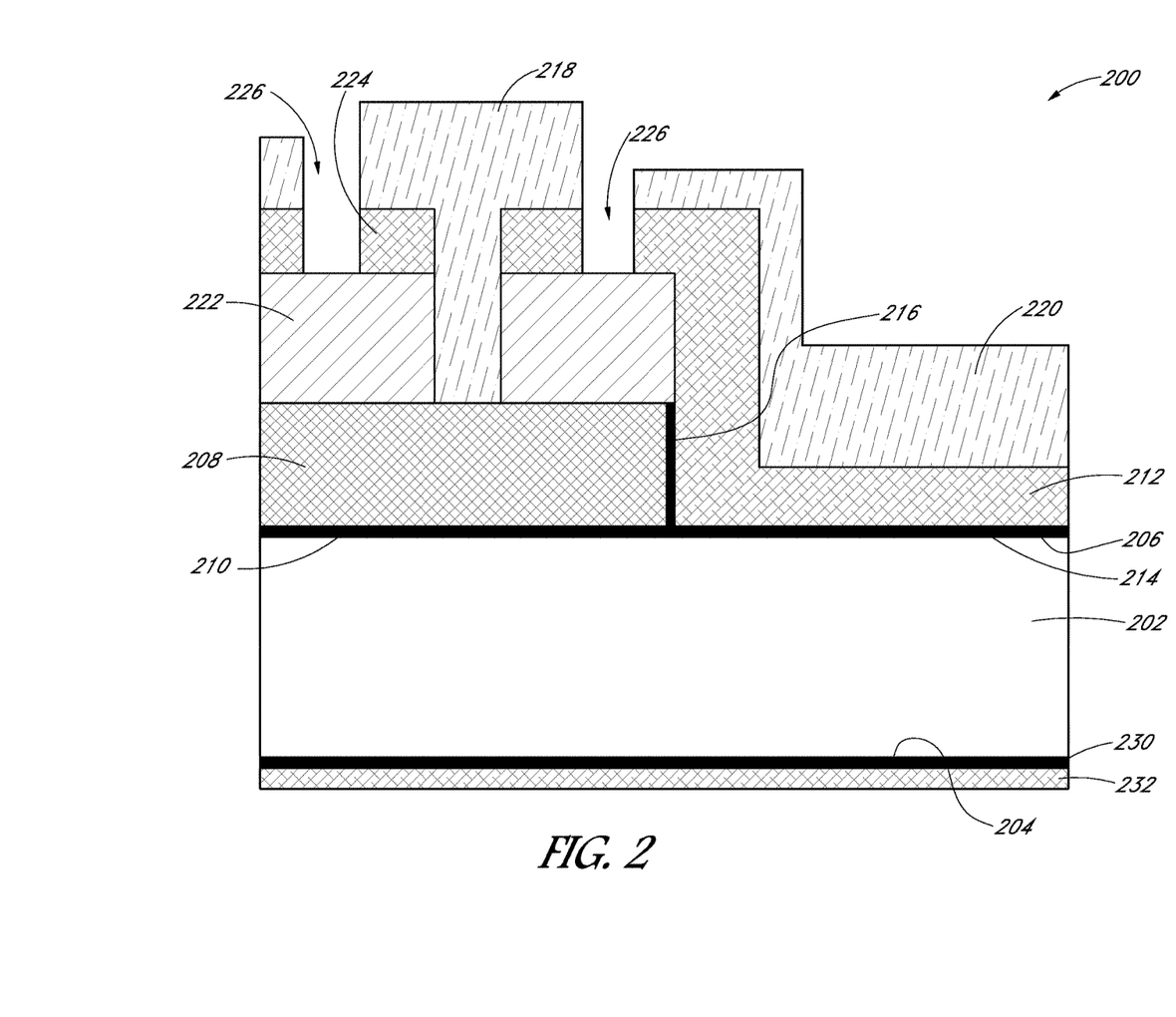
FIG. 2 illustrates a cross-sectional view of a portion of a back contact solar cell, in accordance with another embodiment of the present disclosure.

In a second example, FIG. 2 illustrates a cross-sectional view of a portion of a back contact solar cell 200, in accordance with another embodiment of the present disclosure. The solar cell 200 includes a substrate 202 having a light-receiving surface 204 and a back surface 206. An N-type polycrystalline silicon emitter region 208 is disposed on a first thin dielectric layer 210 disposed on the back surface 206 of the substrate 202. A P-type polycrystalline silicon emitter region 212 is disposed on a second thin dielectric layer 214 disposed on the back surface 206 of the substrate 202. A third thin dielectric layer 216 is disposed laterally directly between the N-type 208 and P-type 212 polycrystalline silicon emitter regions. A first conductive contact structure 218 is disposed on the N-type polycrystalline silicon emitter region 208. A second conductive contact structure 220 is disposed on the P-type polycrystalline silicon emitter region 212.

In accordance with an embodiment of the present disclosure, the first 218 and second 220 conductive contact structures each include a metal silicide layer disposed on the N-type 208 and P-type 212 polycrystalline silicon emitter regions, respectively. In one such embodiment, the metal silicide layer is formed by consuming exposed regions of the N-type 208 and P-type 212 polycrystalline silicon emitter regions in a silicidation process. As such, all exposed top surfaces of the N-type 208 and P-type 212 polycrystalline silicon emitter regions, and any other exposed silicon surfaces, are metalized, as is depicted in FIG. 2. In an embodiment, the first 218 and second 220 conductive contact structures each further includes a metal layer (such as copper) or an aluminum foil disposed on the metal silicide layer. In a particular embodiment, the metal silicide layer includes a material such as, but not limited to, titanium silicide ($TiSi_2$), cobalt silicide ($CoSi_2$), tungsten silicide ($WSi_2$), or nickel silicide ($NiSi$ or $NiSi_2$).

Referring again to FIG. 2, in an embodiment, the solar cell 200 further includes an insulator layer 222 disposed on the N-type polycrystalline silicon emitter region 208. The first conductive contact structure 218 is disposed through the insulator layer 222. Additionally, a portion of the P-type polycrystalline silicon emitter region 212 overlaps the insulator layer 222 but is separate from the first conductive contact structure 218. In an embodiment, an additional P-type polycrystalline silicon layer 224 is disposed on the insulator layer 222, and the first conductive contact structure 218 is disposed through the P-type polycrystalline silicon layer 224 and through the insulator layer 222, as is depicted in FIG. 2. However, in contrast to FIG. 1, the entire top surface of the P-type polycrystalline silicon layer 224 is metalized. As described in greater detail below, in one such embodiment, the additional P-type polycrystalline silicon layer 224 and the P-type polycrystalline silicon emitter region 212 are formed from a same layer that is blanket deposited and then scribed to provide scribe lines 226 therein.

Referring again to FIG. 2, in an embodiment, the back surface 206 of the substrate 202 is essentially entirely flat. However, in another embodiment, the P-type polycrystalline silicon emitter region 212 and the second thin dielectric layer 214 are disposed in a recess, as was described in association with FIG. 1. In one such embodiment, the recess has a texturized surface, and the P-type polycrystalline silicon emitter region 212 and the second thin dielectric layer 214 are conformal with the texturized surface.

Referring again to FIG. 2, in an embodiment, the solar cell 200 further includes a fourth thin dielectric layer 230 disposed on the light-receiving surface 204 of the substrate 202. An N-type polycrystalline silicon layer 232 is disposed on the fourth thin dielectric layer 232. Although not depicted, in an embodiment, an anti-reflective coating (ARC) layer, such as a layer of silicon nitride, is disposed on the polycrystalline silicon layer 232. In one such embodiment, as described in greater detail below, the fourth thin dielectric layer 232 is formed by essentially the same process used to form the second thin dielectric layer 214.

In an embodiment, the substrate 202, the N-type polycrystalline silicon emitter region 208, the P-type polycrystalline silicon emitter region 212 and the various dielectric layers are as described above for the substrate 102, the N-type polycrystalline silicon emitter region 108, the P-type polycrystalline silicon emitter region 112 and the various dielectric layers in association with FIG. 1.

Figure 3:
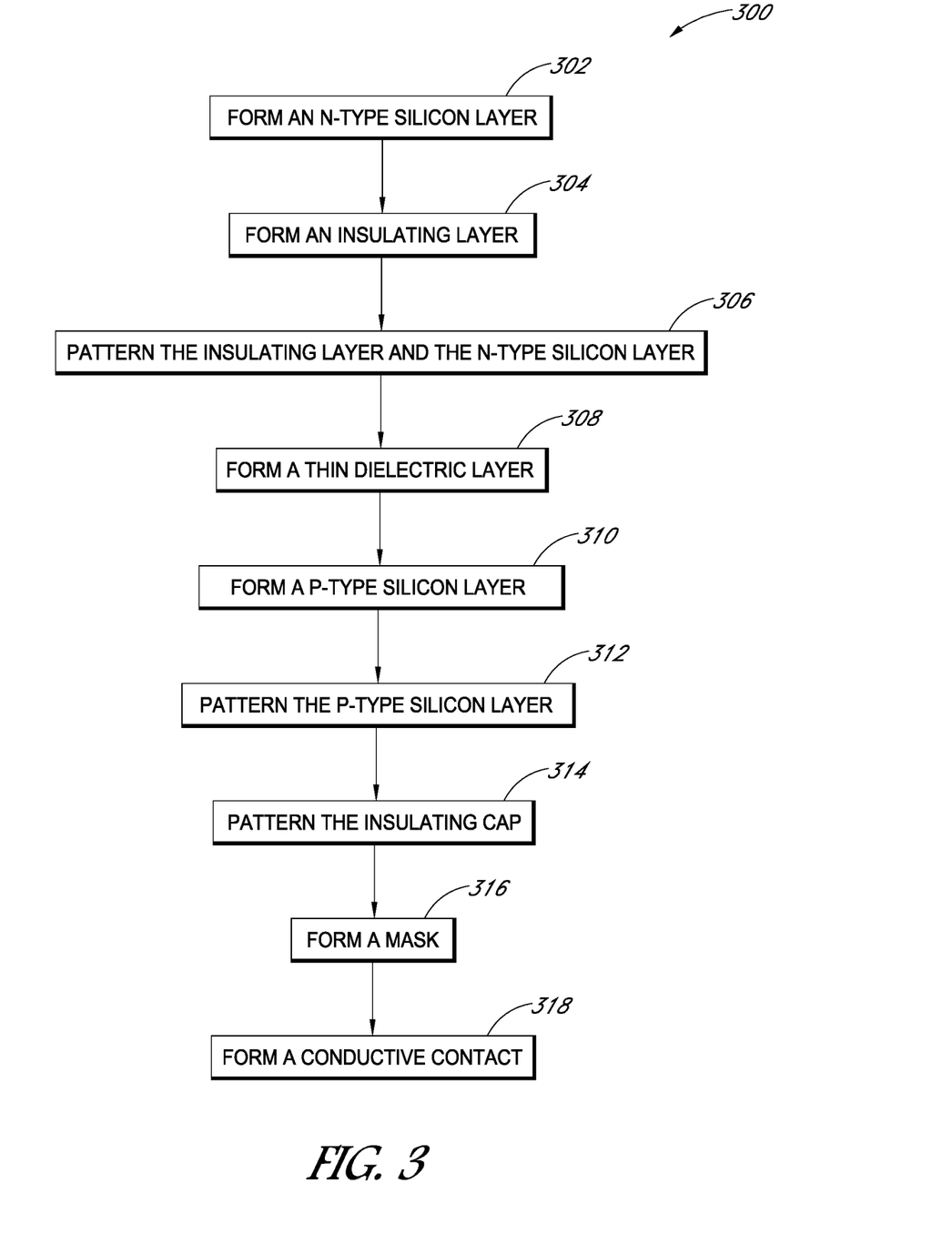
FIG. 3 is a flowchart listing operations in a method of fabricating a solar cell as corresponding to FIGS. 5A-5F, in accordance with an embodiment of the present disclosure.

Also disclosed herein are methods of fabricating solar cells. In a first exemplary process flow, FIGS. 5A-5F illustrate cross-sectional views of various stages in the fabrication of a solar cell, in accordance with an embodiment of the present disclosure. FIG. 3 is a flowchart 300 listing operations in a method of fabricating a solar cell as corresponding to FIGS. 5A-5F, in accordance with an embodiment of the present disclosure.

Figure 5A:
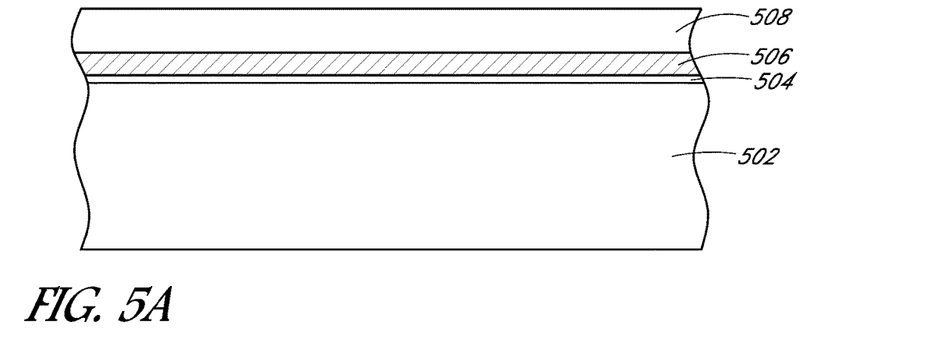
FIGS. 5A-5F illustrate cross-sectional views of various stages in the fabrication of a solar cell, in accordance with an embodiment of the present disclosure.

Referring to FIG. 5A, and corresponding to operation 302 of flowchart 300, a method of fabricating alternating N-type and P-type emitter regions of a solar cell involves forming an N-type silicon layer 506 on a first thin dielectric layer 504 formed on a back surface of a substrate 502.

In an embodiment, the substrate 502 is a monocrystalline silicon substrate, such as a bulk single crystalline N-type doped silicon substrate. It is to be understood, however, that substrate 502 may be a layer, such as a multi-crystalline silicon layer, disposed on a global solar cell substrate. In an embodiment, the first thin dielectric layer 504 is a thin oxide layer such as a tunnel dielectric silicon oxide layer having a thickness of approximately 2 nanometers or less.

In an embodiment, the N-type silicon layer 506 is a polycrystalline silicon layer that is doped to have N-type conductivity type either through in situ doping during deposition, post deposition implanting, post deposition solid state diffusion, or a combination thereof. In another embodiment the N-type silicon layer 506 is an amorphous silicon layer such as a hydrogenated silicon layer represented by a-Si:H which is implanted or diffused with N-type dopants subsequent to deposition of the amorphous silicon layer. In one such embodiment, N-type silicon layer 506 is subsequently annealed (at least at some subsequent stage of the process flow) to ultimately form an N-type polycrystalline silicon layer. In an embodiment, for either a polycrystalline silicon layer or an amorphous silicon layer, if post deposition implantation is performed, the implanting is performed by using ion beam implantation or plasma immersion implantation. In one such embodiment, a shadow mask is used for the implanting. In another embodiment, for either a polycrystalline silicon layer or an amorphous silicon layer, if post deposition diffusion is performed, a solid state doping layer such as phosphosilicate glass (PSG) is used either as a sacrificial layer or permanent layer deposited on the polycrystalline silicon layer or amorphous silicon layer. In a specific embodiment, the N-type dopants are phosphorus or arsenic impurity atoms.

Referring again to FIG. 5A and now to corresponding operation 304 of flowchart 300, an insulating layer 508 is formed on the N-type silicon layer 506. In an embodiment the insulating layer 508 includes silicon dioxide.

Figure 5B:
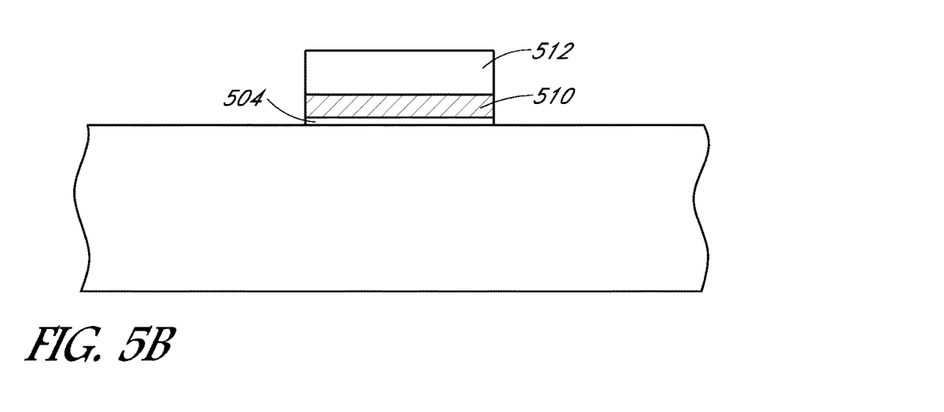

Referring to FIG. 5B and corresponding operation 306 of flowchart 300, the insulating layer 508 and the N-type silicon layer 506 are patterned to form an N-type silicon region 510 having an insulating cap 512 thereon. In an embodiment, a lithographic or screen print masking and subsequent etch process is used to pattern the insulating layer 508 and the N-type silicon layer 506. In another embodiment, a laser ablation process (e.g., direct write) is used to pattern the insulating layer 508 and the N-type silicon layer 506. In either case, in one embodiment, the first thin dielectric layer 504 is also patterned in the process, as is depicted in FIG. 5B.

Figure 5C:
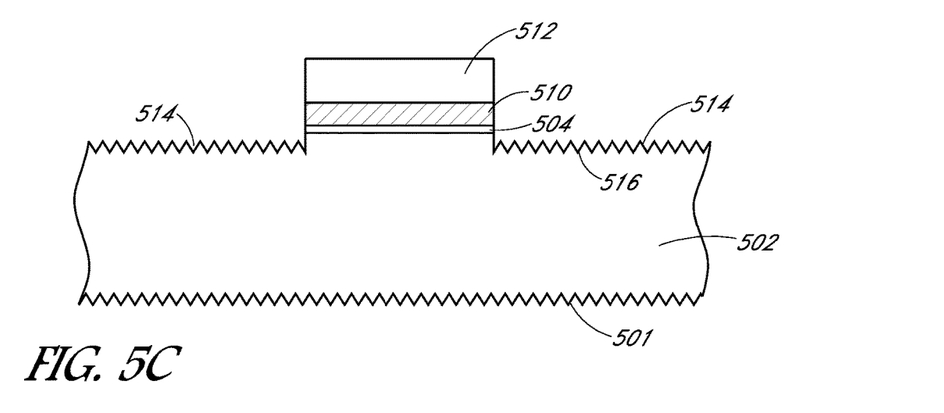

Referring to FIG. 5C, optionally, trenches or recesses 514 may be formed in the substrate 502 during (or subsequent to) the patterning of the insulating layer 508 and the N-type silicon layer 506. Furthermore, in one embodiment, the surfaces 516 of the recesses 514 are texturized. In a same or similar process, a light receiving surface 501 of the substrate 502 may also be texturized, as is depicted in FIG. 5C. In an embodiment, a hydroxide-based wet etchant is used to form at least a portion of the recesses 514 and/or to texturize exposed portions of the substrate 502. In an embodiment, each of the trenches has a depth approximately in the range of 0.1-3 microns from the back surface and into the substrate 502.

It is to be appreciated that the texturizing of the back surface and even the recess formation may be omitted from the process flow. It is also to be appreciated that the timing of the front side texturizing, is applied, can be performed at different locations along the process flow, e.g., prior to back side emitter region formation, subsequent to back side emitter region formation, or as part of the process of back side emitter region formation. In one such embodiment, the front side texturizing is performed prior to back side emitter region formation, and the texturized front side is protected by a sacrificial or permanent capping layer during subsequent back side emitter region formation. It is also to be appreciated that, whether on the front side or back side, a texturized surface may be one which has a regular or an irregular shaped surface for scattering incoming light, decreasing the amount of light reflected off of the light-receiving and/or exposed surfaces of the solar cell.

Figure 5D:
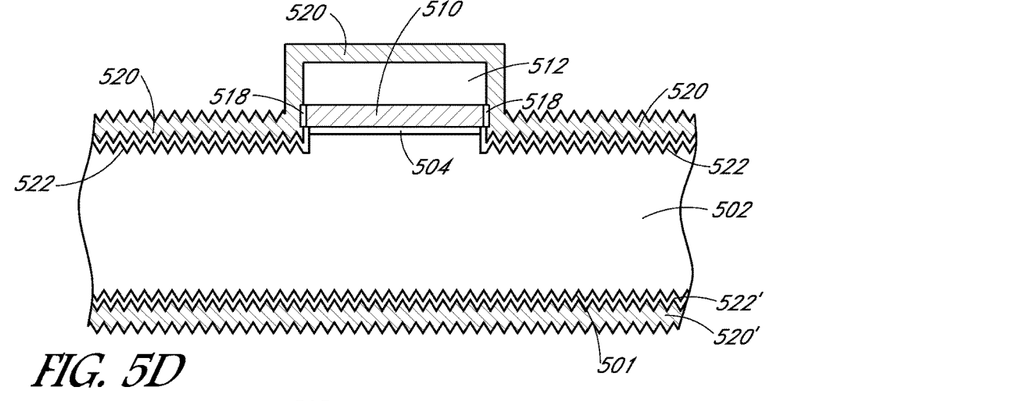

Referring to FIG. 5D and corresponding operation 308 of flowchart 300, a second thin dielectric layer 518 is formed on exposed sides of the N-type silicon region 510. In an embodiment, the second thin dielectric layer 518 is formed in an oxidation process and is a thin oxide layer such as a tunnel dielectric silicon oxide layer having a thickness of approximately 2 nanometers or less. In another embodiment, the second thin dielectric layer 504 is formed in a deposition process and is a thin silicon nitride layer or silicon oxynitride layer.

Referring again to FIG. 5D and now to corresponding operation 310 of flowchart 300, a P-type silicon layer 520 is formed on a third thin dielectric layer 522 formed on the back surface of the substrate 502, and on the second thin dielectric layer 518 and the insulating cap 512 of the N-type silicon region 510. Corresponding thin dielectric layer 522' may also be formed on the light-receiving surface 501 of the substrate 502, in a same or similar process operations, as is depicted in FIG. 5D.

Additionally, an N-type silicon layer 520' may also be formed on the light-receiving surface 501 of the substrate 502, as is depicted in FIG. 5D. In one such embodiment, the N-type silicon layer 520' is formed using an initially undoped or lightly doped silicon layer formed on the front side at the same time as forming a corresponding initially undoped or lightly doped silicon layer ultimately used to form the P-type silicon layer 520. The N-type silicon layer 520' is then formed by subsequent N-type doping of the initially undoped or lightly doped silicon layer. Furthermore, although not depicted, an ARC layer may be formed on the corresponding N-type silicon layer 520'.

In an embodiment, the third thin dielectric layer 518 is formed in an oxidation process and is a thin oxide layer such as a tunnel dielectric silicon oxide layer having a thickness of approximately 2 nanometers or less. In an embodiment, the P-type silicon layer 520 is a polycrystalline silicon layer that is doped to have P-type conductivity type either through in situ doping, post deposition implanting, post deposition solid state diffusion, or a combination thereof. In another embodiment the P-type silicon layer 520 is an amorphous silicon layer such as a hydrogenated silicon layer represented by a-Si:H which is implanted or diffused with P-type dopants subsequent to deposition of the amorphous silicon layer. In one such embodiment, the P-type silicon layer 520 is subsequently annealed (at least at some subsequent stage of the process flow) to ultimately form a P-type polycrystalline silicon layer. In an embodiment, for either a polycrystalline silicon layer or an amorphous silicon layer, if post deposition implantation is performed, the implanting is performed by using ion beam implantation or plasma immersion implantation. In one such embodiment, a shadow mask is used for the implanting. In another embodiment, for either a polycrystalline silicon layer or an amorphous silicon layer, if post deposition diffusion is performed, a solid state doping layer such as borosilicate glass (BSG) is used either as a sacrificial layer or permanent layer deposited on the polycrystalline silicon layer or amorphous silicon layer. In a specific embodiment, the P-type dopants are boron impurity atoms.

In an embodiment, the N-type silicon region 510 has a thickness relative to a thickness of each of the P-type silicon layer 520 by a ratio of 3:1 or less. In an embodiment, the thickness of the N-type silicon region 510 is 1000 Angstroms or less, and the thickness of the P-type silicon layer 520 is approximately 300 Angstroms. In an embodiment, the N-type silicon region 510 is formed using an in situ doping chemical vapor deposition (CVD) process, and the P-type silicon layer 520 is formed using a solid-state doping process.

Figure 5E:
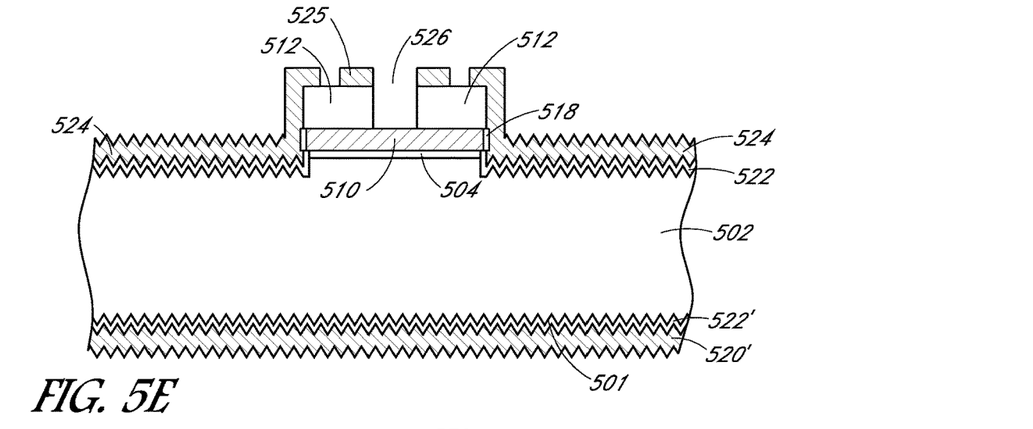

Referring to FIG. 5E and corresponding operation 312 of flowchart 300, the P-type silicon layer 520 is patterned to form isolated P-type silicon regions 524 and to form a contact opening 526 in regions of the P-type silicon layer 520 above the insulating cap 512 of the N-type silicon region 510. In an embodiment, discrete regions of P-type silicon 525 may remain as an artifact of the patterning process. In an embodiment, a laser ablation process is used to pattern the P-type silicon layer 520.

Referring again to FIG. 5E and now to corresponding operation 314 of flowchart 300, the insulating cap 512 is patterned through the contact openings 526 to expose portions of the N-type silicon region 510. In an embodiment, the insulating cap 512 is patterned using a laser ablation process. For example, in one embodiment, a first laser pass is used to pattern the P-type silicon layer 520, including forming contact opening 526. A second laser pass in the same location as contact opening 526 is the used to pattern the insulating cap 512.

Figure 5F:
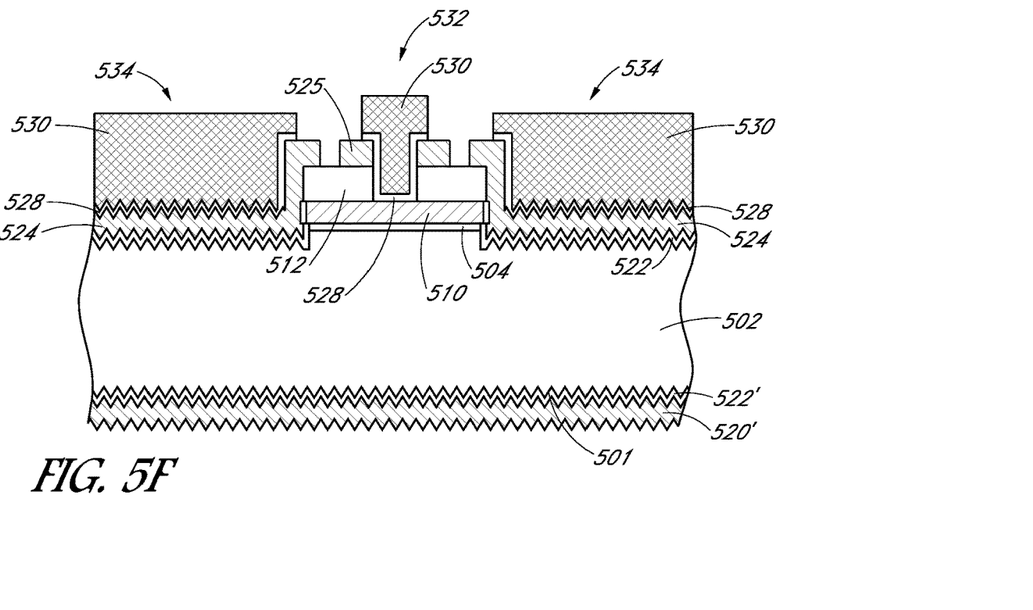

Referring to FIG. 5F and to corresponding operation 318 of flowchart 300, conductive contacts 532 and 534 are formed for the N-type silicon region 510 and the isolated P-type silicon regions 524, respectively. The fabrication of the conductive contacts 532 and 534 can involve use of one or more sputtered, plated or bonded conductive layers. In an embodiment, the conductive contacts are formed by first forming a metal seed layer 528 on the exposed portions of the N-type silicon region 510 and on the isolated P-type silicon regions 524. In an embodiment, referring to operation 316 of flowchart 300, a mask is first formed to expose only select portions of the N-type silicon region 510 and the isolated P-type silicon regions 524 in order to direct the metal seed layer 528 formation to restricted locations.

In an embodiment, the metal seed layer 528 is an aluminum-based metal seed layer. In an embodiment, the metal seed layer 528 includes a layer having a thickness approximately in the range of 0.05 to 20 microns and includes aluminum in an amount greater than approximately 90 atomic %. In an embodiment, the metal seed layer 528 is deposited as a blanket layer which is later patterned, e.g., thus using a deposition, lithographic, and etch approach. In another embodiment, the metal seed layer 528 is deposited as patterned layer. In one such embodiment, the patterned metal seed layer 528 is deposited by printing the patterned metal seed layer.

In an embodiment, contact formation further includes forming a metal layer 530 by plating on the metal seed layer 528 to form conductive contacts 532 and 534 for the N-type silicon region 510 and the isolated P-type silicon regions 524, respectively. In an embodiment, the metal layer 530 is a copper layer. Accordingly, in an embodiment, the conductive contacts 532 and 534 are formed by first forming a metal seed layer 528 and then performing an electroplating process.

In another embodiment, the conductive contacts 532 and 534 are formed by printing a paste. The paste may be composed of a solvent and the aluminum/silicon (Al/Si) alloy particles. A subsequent electroplating or electroless-plating process may then be performed. The paste may be formed in addition to, or in place of, the metal seed layer 528.

In another embodiment, the conductive contacts 532 and 534 are formed by first forming the metal seed layer 528 and then adhering a metal foil layer to the metal seed layer 528. In one such embodiment, the metal foil is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. In an embodiment, the metal foil is welded to the metal seed layer 528. The metal foil may subsequently be patterned, e.g., by laser ablation and/or etching.

In another embodiment, a metal wire is formed on the metal seed layer 528. In one such embodiment, the wire is an aluminum (Al) or copper (Cu) wire. In an embodiment, the metal wire is welded to the metal seed layer 528.

It is to be appreciated that the above described nexus between the cross-sectional views of FIGS. 5A-5F and the flowchart of FIG. 3 is an exemplary embodiment of the method illustrated in the flowchart 300 of FIG. 3. However, embodiments of the flowchart 300 of FIG. 3 are not so limited.

Referring more generally to the flowchart 300 of FIG. 3, at operation 302, a method of fabricating a solar cell includes forming an N-type silicon layer. At operation 304, the method also includes forming an insulating layer. At operation 306, the method also includes patterning the insulating layer and then the N-type silicon layer. At operation 308, the method also includes forming a thin dielectric layer. At operation 310, the method also includes forming a P-type silicon layer. At operation 312, the method also includes patterning the P-type silicon layer. At operation 314, the method also includes patterning the insulating cap. At operation 316, the method also includes forming a mask. At operation 318, the method also includes forming a conductive contact.

Figure 4:
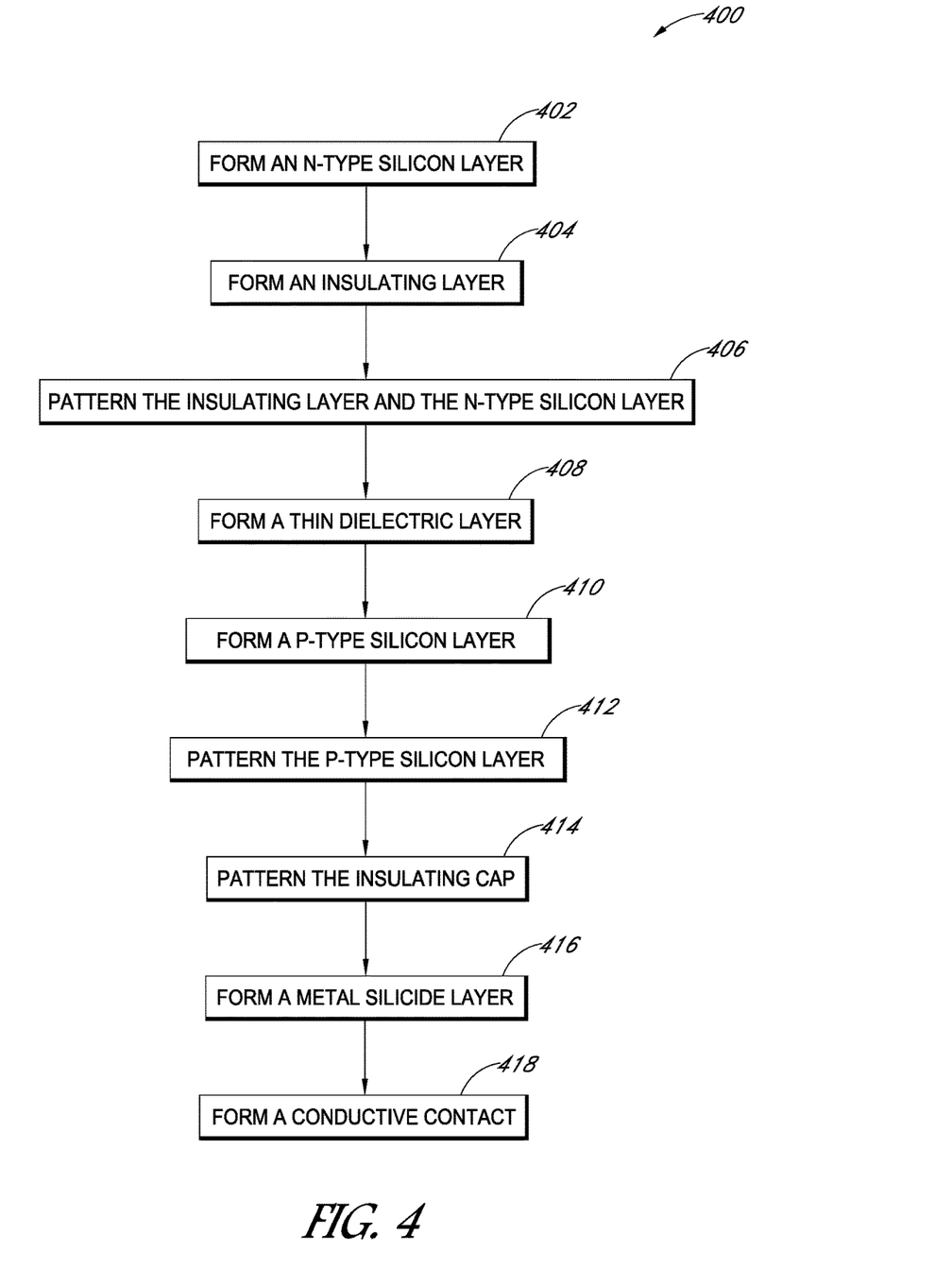
FIG. 4 is a flowchart listing operations in a method of fabricating a solar cell as corresponding to FIGS. 5A-5E and 6A-6B, in accordance with an embodiment of the present disclosure.
Figure 6A:
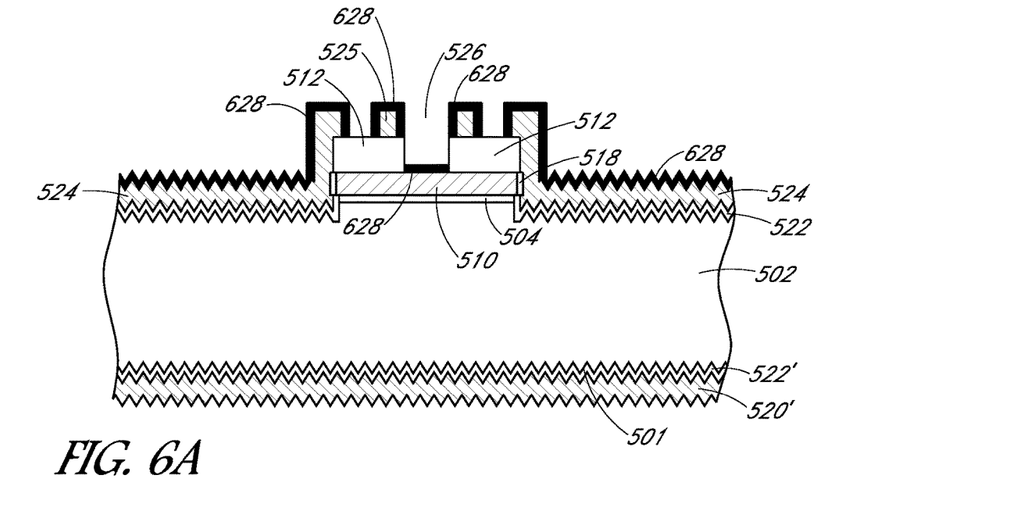
FIGS. 6A-6B illustrate cross-sectional views of various stages in the fabrication of a solar cell, in accordance with another embodiment of the present disclosure.
Figure 6B:
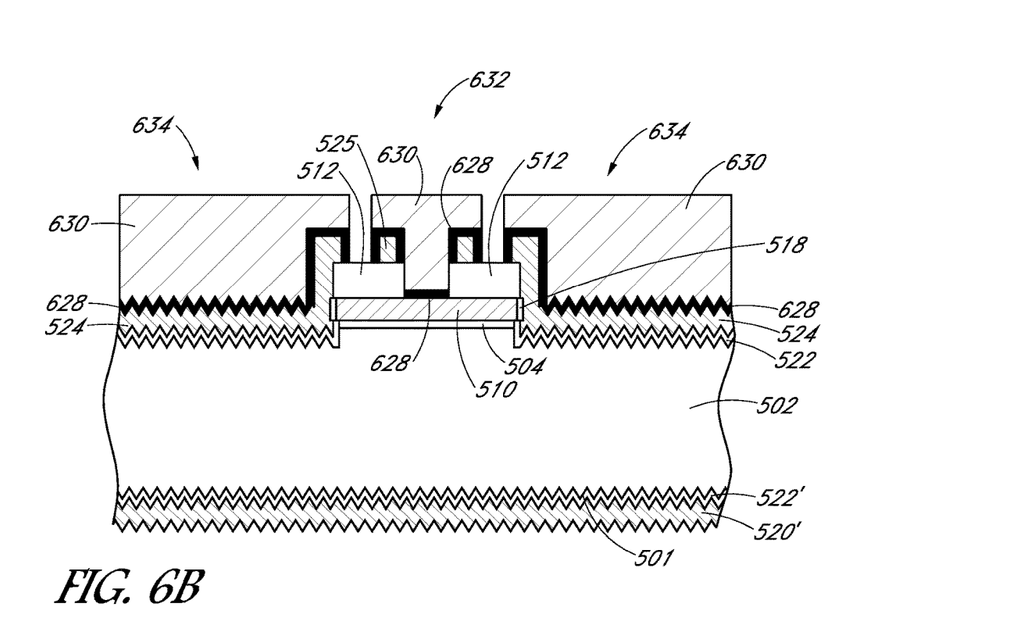

In a second exemplary process flow, FIGS. 6A-6B illustrate cross-sectional views of various stages in the fabrication of another solar cell, in accordance with another embodiment of the present disclosure. FIG. 4 is a flowchart 400 listing operations in a method of fabricating a solar cell as corresponding to FIGS. 5A-5E and 6A-6B, in accordance with an embodiment of the present disclosure. Accordingly, the second exemplary process flow moves from the structure of FIG. 5E to the structure of FIG. 6A. Operations 402 through 414 of flowchart 400 correspond to operations 302 through 314 of flowchart 300.

Referring to FIG. 6A and to corresponding operation 416 of flowchart 400, subsequent to patterning the P-type silicon layer 520 and the insulating cap 512 (as described in association with FIG. 5E), a metal silicide layer 628 is formed from exposed surfaces of the isolated P-type silicon regions 524 and from the exposed portions of the N-type silicon region 510. In an embodiment, the metal silicide layer is formed by forming a blanket metal layer over the entire structure of FIG. 5E, heating the blanket metal layer to react with exposed silicon and form a metal silicide. Unreacted portions of the blanket metal layer are then removed, e.g., using a wet chemical clean process that is selective to the formed silicide material. In one embodiment, the metal silicide layer 628 includes a material such as, but not limited to, titanium silicide (TiSi$_2$), cobalt silicide (CoSi$_2$), tungsten silicide (WSi$_2$), or nickel silicide (NiSi or NiSi$_2$). In an embodiment, a rapid thermal processing (RTP) anneal is used to form the silicide. In that embodiment, dopants in the silicon layers of the emitter region are activated in the same RTP process. In one embodiment, the RTP process is performed in an oxygen-free or low oxygen environment to reduce oxidation of the silicide metal. However, in another embodiment, a silicide process temperature is lower than the temperature of a separate anneal used for dopant activation.

Referring to FIG. 6B and to corresponding operation 418 of flowchart 400, conductive contacts 632 and 634 are formed for the N-type silicon region 510 and the isolated P-type silicon regions 524, respectively. The fabrication of the conductive contacts 632 and 634 can involve use of one or more plated or bonded conductive layers. In an embodiment, the conductive contacts 632 and 634 are formed by forming electrically conductive material on the metal silicide layer 628 on the exposed portions of the N-type silicon region 510 and on the isolated P-type silicon regions 524.

In an embodiment, contact formation includes forming a metal layer 630 by plating on the metal silicide layer 628 to form conductive contacts 632 and 634 for the N-type silicon region 510 and the isolated P-type silicon regions 524, respectively. In an embodiment, the metal layer 630 is a copper layer. Accordingly, in an embodiment, the conductive contacts 632 and 634 are formed by first forming a metal silicide layer 628 and then performing an electroplating process.

In another embodiment, the conductive contacts 632 and 634 are formed by first forming the metal silicide layer 628 and then adhering a metal foil layer to the metal silicide layer 628. In one such embodiment, the metal foil is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. In an embodiment, the metal foil is welded to the metal silicide layer 628. The metal foil may subsequently be patterned, e.g., by laser ablation and/or etching.

In another embodiment, a metal wire is formed on the metal silicide layer 628. In one such embodiment, the wire is an aluminum (Al) or copper (Cu) wire. In an embodiment, the metal wire is welded to the metal silicide layer 628.

It is to be appreciated that the silicidation process for contact formation described in association with FIGS. 6A and 6B, as contrasted to the contact formation described in association with FIG. 5F, may utilize one less mask. In particular, a metal seed layer does not need to be directed by a mask in the silicidation process since silicide will form only on regions of exposed silicon, which have already been patterned. As such, in an embodiment, the silicidation process is a self-aligned process which can be implemented to mitigate alignment issues and, possibly, reduce the pitch achievable for cell contact fabrication.

It is to be appreciated that the above described nexus between the cross-sectional views of FIGS. 5A-5E, 6A, 6B and the flowchart of FIG. 4 is an exemplary embodiment of the method illustrated in the flowchart 400 of FIG. 4. However, embodiments of the flowchart 400 of FIG. 4 are not so limited.

Referring more generally to the flowchart 400 of FIG. 4, at operation 402, a method of fabricating a solar cell includes forming an N-type silicon layer. At operation 404, the method also includes forming an insulating layer. At operation 406, the method also includes patterning the insulating layer and then the N-type silicon layer. At operation 408, the method also includes forming a thin dielectric layer. At operation 410, the method also includes forming a P-type silicon layer. At operation 412, the method also includes patterning the P-type silicon layer. At operation 414, the method also includes patterning the insulating cap. At operation 416, the method also includes forming a metal silicide layer. At operation 418, the method also includes forming a conductive contact.

Figure 7:
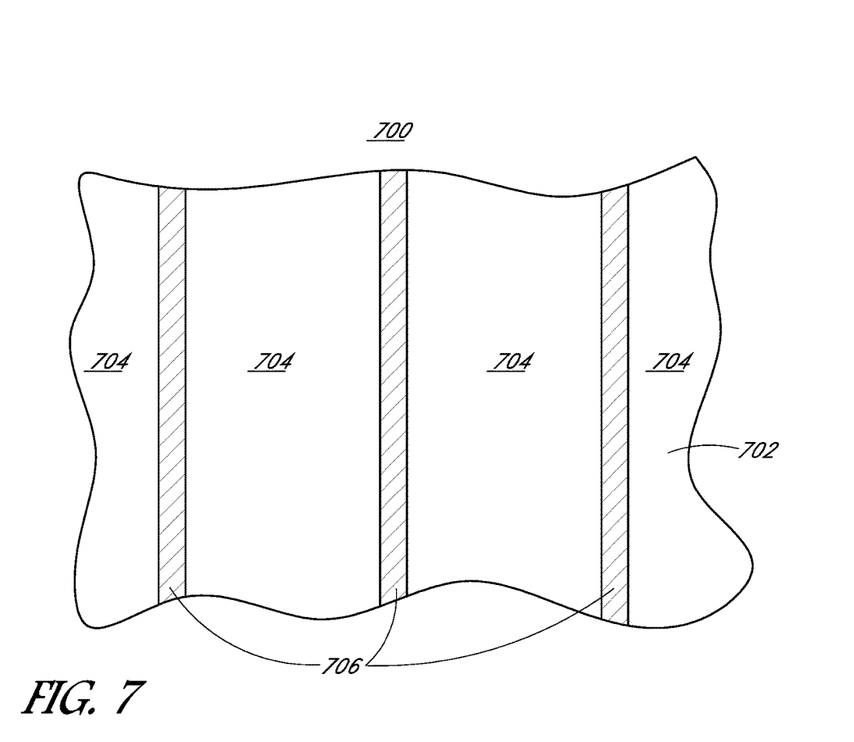
FIG. 7 illustrates a plan view of a portion of a back contact solar cell, in accordance with another embodiment of the present disclosure.

FIG. 7 illustrates a plan view of a portion 700 of a back contact solar cell, in accordance with another embodiment of the present disclosure. Referring to FIG. 7, the portion 700 of the back contact solar cell includes a plurality of N-type polycrystalline silicon regions 704 and a plurality of P-type polycrystalline silicon regions 706 above a substrate 702. In an embodiment, the plurality of N-type polycrystalline silicon regions 704 and the plurality of P-type polycrystalline silicon regions have a differentiated architecture as described above in association with FIGS. 1, 2, 5F and 6B.

It is to be appreciated that in the representation of FIG. 7, only the surface area of the plurality of N-type polycrystalline silicon regions 704 and the plurality of P-type polycrystalline silicon regions 706 directly over the substrate 702 are shown. That is, while portions of the P-type polycrystalline silicon regions may overlap with portions of the plurality of N-type polycrystalline silicon regions 704, as is described above, such portions are not shown in FIG. 7. In one such embodiment, a total area of the plurality of N-type polycrystalline silicon regions 704 is greater than a total area of the plurality of P-type polycrystalline silicon regions 706. In a specific such embodiment, the total area of the plurality of N-type polycrystalline silicon regions 704 is greater than the total area of the plurality of P-type polycrystalline silicon regions 706 by a ratio of 15:1 or more.

Figure 8:
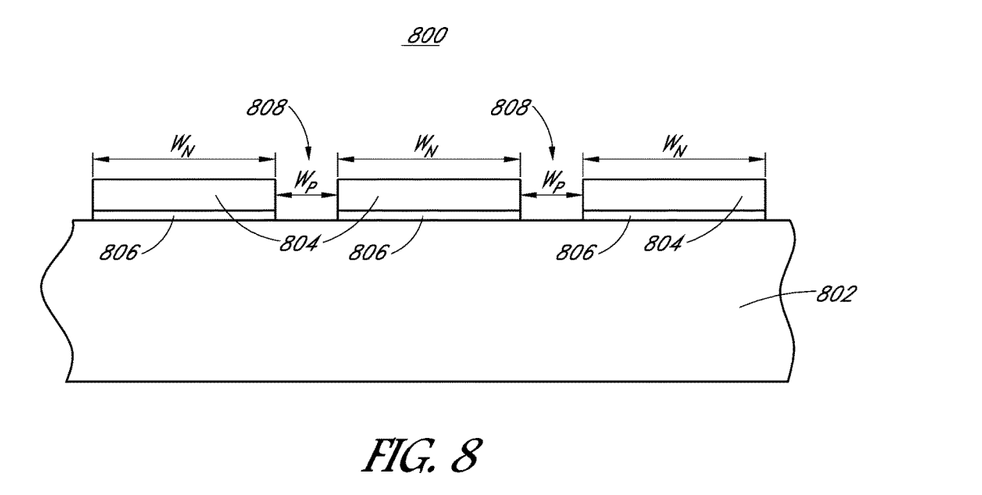
FIG. 8 illustrates a cross-sectional view of a portion of a back contact solar cell, in accordance with another embodiment of the present disclosure.

FIG. 8 illustrates a cross-sectional view of a portion 800 of a back contact solar cell, in accordance with another embodiment of the present disclosure. Referring to FIG. 8, the portion 800 of the back contact solar cell includes a plurality of N-type polycrystalline silicon regions 804 (which may be on thin dielectric layers 806). A plurality of locations 808 separates the N-type polycrystalline silicon regions 804. The plurality of locations 808 represents locations where a plurality of P-type polycrystalline silicon regions will ultimately be formed. In an embodiment, the plurality of N-type polycrystalline silicon regions 804 and the (ultimately formed) plurality of P-type polycrystalline silicon regions have a differentiated architecture as described above in association with FIGS. 1, 2, 5F and 6B.

It is to be appreciated that in the representation of FIG. 8, only the surface area of the plurality of N-type polycrystalline silicon regions 804 and regions 808 where the plurality of P-type polycrystalline silicon regions are directly over the substrate 802 are shown. That is, while portions of the P-type polycrystalline silicon regions may ultimately be formed to overlap with portions of the plurality of N-type polycrystalline silicon regions 804, as is described above, such portions are not accommodated for in the width WP of the locations 808 of FIG. 8. In one such embodiment, each of the plurality of N-type polycrystalline silicon regions has a width (WN) greater than a width (Wp) of the direct substrate locations 808 each of the plurality of P-type polycrystalline silicon regions. In a specific such embodiment, each of the plurality of N-type polycrystalline silicon regions has a width (WN) greater than a width (Wp) of the direct substrate locations 808 each of the plurality of P-type polycrystalline silicon regions by a ratio of 5:1 or more.

Although certain materials are described specifically with reference to above described embodiments, some materials may be readily substituted with others with such embodiments remaining within the spirit and scope of embodiments of the present disclosure. For example, in an embodiment, a different material substrate, such as a group III-V material substrate, can be used instead of a silicon substrate. Furthermore, it is to be understood that, where the ordering of N+ and then P+ type doping is described specifically for emitter regions on a back surface of a solar cell, other embodiments contemplated include the opposite ordering of conductivity type, e.g., P+ and then N+ type doping, respectively. In other embodiments, a P-type doped substrate is used in place of an N-type doped substrate. In other embodiments, a doping window used to dope the substrate is a relatively large doping window. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Furthermore, in an embodiment, a cluster chemical vapor deposition (CVD) tool can be used to combine many of the above described process operations in a single pass in a process tool. For example, in one such embodiment, up to four distinct CVD operations and an RTP operation can be performed in a single pass in a cluster tool. The CVD operations can includes depositions of layers such as the above described back side P+ polysilicon layer, both front and back side N+ polysilicon layers, and the ARC layer. In one embodiment, the cluster CVD tool is a cluster plasma enhanced chemical vapor deposition (PECVD) tool.

Thus, methods of fabricating solar cell emitter regions with differentiated P-type and N-type region architectures, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
an N-type semiconductor substrate having a light-receiving surface and a back surface;
a plurality of N-type polycrystalline silicon regions disposed on a first thin dielectric layer disposed on the back surface of the N-type semiconductor substrate; and
a plurality of P-type polycrystalline silicon regions disposed on a second thin dielectric layer disposed in a corresponding one of a plurality of trenches interleaving the plurality of N-type polycrystalline silicon regions in the back surface of the N-type semiconductor substrate, wherein a total area of the plurality of N-type polycrystalline silicon regions is greater than a total area of the plurality of P-type polycrystalline silicon regions in the plurality of corresponding trenches.

2. The solar cell of claim 1, wherein the total area of the plurality of N-type polycrystalline silicon regions is greater than the total area of the plurality of P-type polycrystalline silicon regions in the plurality of corresponding trenches by a ratio of 15:1 or more.

3. The solar cell of claim 1, wherein the plurality of P-type polycrystalline silicon regions overlap a portion of the plurality of N-type polycrystalline silicon regions.

4. The solar cell of claim 1, wherein each of the plurality of N-type polycrystalline silicon regions has a width greater than a width of each of the plurality of P-type polycrystalline silicon regions by a ratio of 5:1 or more.

5. The solar cell of claim 1, wherein each of the plurality of N-type polycrystalline silicon regions has a thickness relative to a thickness of each of the plurality of P-type polycrystalline silicon regions by a ratio of 3:1 or less.

6. The solar cell of claim 1, wherein each of the plurality of trenches has a depth approximately in the range of 0.1-3 microns from the back surface and into the N-type semiconductor substrate.

7. The solar cell of claim 1, wherein each of the plurality of trenches has a texturized surface.

8. The solar cell of claim 1, further comprising:
a third thin dielectric layer disposed laterally directly between adjacent ones of the N-type polycrystalline silicon regions and the P-type polycrystalline silicon regions.

9. The solar cell of claim 1, further comprising:
a plurality of conductive contact structures electrically connected to the N-type polycrystalline silicon regions and the P-type polycrystalline silicon regions.

* * * * *